United States Patent
Hsu et al.

(10) Patent No.: US 10,985,543 B2
(45) Date of Patent: Apr. 20, 2021

(54) HANGING ASSEMBLY AND DISPLAY APPARATUS HAVING THE SAME

(71) Applicant: Wistron Corporation, New Taipei (TW)

(72) Inventors: Tze-Tien Hsu, New Taipei (TW); Chin-Kun Ko, New Taipei (TW); Cheng-Hua Tien, New Taipei (TW); Wei-Hsien Chien, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 16/663,377

(22) Filed: Oct. 25, 2019

(65) Prior Publication Data

US 2021/0057896 A1 Feb. 25, 2021

(30) Foreign Application Priority Data

Aug. 21, 2019 (TW) ................................. 108211078

(51) Int. Cl.
*H02G 3/32* (2006.01)
*H01B 7/04* (2006.01)
*H05K 5/02* (2006.01)

(52) U.S. Cl.
CPC .................. *H02G 3/32* (2013.01); *H01B 7/04* (2013.01); *H05K 5/0217* (2013.01)

(58) Field of Classification Search
CPC ........ G09F 2007/186; G09F 7/18; G09F 7/20; F16M 13/027; H02G 3/32; H02G 3/30; H01B 7/04; H05K 5/0217
See application file for complete search history.

(56) References Cited

U.S. PATENT DOCUMENTS

| 9,775,264 B1 | 9/2017 | Chiu et al. |
| 2006/0000634 A1* | 1/2006 | Arakawa ................ F21V 21/104 174/128.1 |
| 2017/0053569 A1* | 2/2017 | Votolato .................. G09F 27/00 |
| 2019/0279540 A1* | 9/2019 | Trachtenberg ........ G06F 3/1423 |

FOREIGN PATENT DOCUMENTS

| CN | 206059710 | 3/2017 |
| TW | I612815 | 1/2018 |
| TW | I671624 | 9/2019 |

* cited by examiner

*Primary Examiner* — James Wu
(74) *Attorney, Agent, or Firm* — JCIPRNET (57) ABSTRACT

A hanging assembly includes at least one flexible hanging cable, at least one first fixing component, and a frame. The flexible hanging cable includes a power wire and a hanging wire combined with each other. The first fixing component is connected to the flexible hanging cable and adapted to be fixed at a fixed position. The frame is adapted to be fixed at the fixed position, and the at least one first fixing component is adapted to be fixed on the frame. In addition, a display apparatus applying the hanging assembly is also provided.

26 Claims, 14 Drawing Sheets

HANGING ASSEMBLY AND DISPLAY APPARATUS HAVING THE SAME

CROSS-REFERENCE TO RELATED APPLICATION

This application claims the priority benefit of Taiwan application serial no. 108211078, filed on Aug. 21, 2019. The entirety of the above-mentioned patent application is hereby incorporated by reference herein and made a part of this specification.

BACKGROUND

Technical Field

The disclosure relates to a hanging assembly and an apparatus having the same, and particularly relates to a hanging assembly for hanging a display device and a display apparatus having the same.

Description of Related Art

In recent years, displays have been widely used. Various types of electronic billboards, such as shopping mall advertisements and government information dissemination, convey various types of information through push-and-roll. When apparatuses are installed, different types of displays must be effectively installed in designated places, and factors, such as location, aesthetics and safety, must be considered. Accessories, such as display hangers (ceiling type hangers, wallboard type hangers, and the like) or floor-standing billboard bases, are used and collocated with indoor decoration for hiding cables, such as power wires, signal wires and network wires, for displays to achieve the purpose of aesthetics. In the hanging accessories, in order to facilitate the wiring of the cables, a display is generally hung by a pipe having a large pipe diameter, so that the cables can be hidden in the pipe. However, the pipe having a large pipe diameter is too obvious visually and affects the aesthetics of the device. Furthermore, due to the space and appearance configuration, the pipe should not be too long, which makes it difficult to perform maintenance and installation operations.

At present, some displays are mounted in a steel cable hanging mode to replace the pipe of the hanging accessory. However, in this configuration mode, even if the signal of the display is subjected to wireless transmission instead to omit the configuration of signal wires and network wires, power wires still need to be configured and cannot be hidden.

SUMMARY

The disclosure is directed to a hanging assembly and a display apparatus having the same, which can enable a display device to be mounted aesthetically.

The hanging assembly of the disclosure comprises at least one flexible hanging cable, at least one first fixing component and a frame. The flexible hanging cable comprises a power wire and a hanging wire combined with each other. The first fixing component is connected to the flexible hanging cable and adapted to be fixed at a fixed position. The frame is adapted to be fixed at the fixed position, wherein the at least one first fixing component is adapted to be fixed on the frame.

In an embodiment of the disclosure, the power wire and the hanging wire are coaxially arranged.

In an embodiment of the disclosure, the power wire is coated by the hanging wire.

In an embodiment of the disclosure, the structural strength of the hanging wire is greater than the structural strength of the power wire.

In an embodiment of the disclosure, the flexible hanging cable comprises a protection layer, and the protection layer coats the power wire and the hanging wire.

In an embodiment of the disclosure, the structural strength of the hanging wire is greater than the structural strength of the protection layer.

In an embodiment of the disclosure, the hanging assembly includes at least one second fixing component connected to the at least one flexible hanging cable and adapted to be fixed at a hanging position.

In an embodiment of the disclosure, the power wire is adapted to be electrically connected to a display device, and the display device is adapted to be fixed with the at least one second fixing component at the hanging position.

In an embodiment of the disclosure, the maximum load of the hanging wire is at least four times the weight of the display device.

In an embodiment of the disclosure, the hanging assembly comprises a power adapter module, wherein the power adapter module is adapted to be arranged on the display device and electrically connected to the display device, and the at least one flexible hanging cable is adapted to be inserted in the power adapter module.

In an embodiment of the disclosure, the power adapter module comprises a power adapter plate and a power adapter, the power adapter plate is adapted to be fixed on the display device, and the power adapter is connected to the power adapter plate and electrically connected to the display device and is adapted to the at least one flexible hanging cable for inserting.

In an embodiment of the disclosure, the hanging wire is a steel cable.

In an embodiment of the disclosure, the hanging assembly comprises a frame, wherein the frame is adapted to be fixed at the fixed position, and the at least one first fixing component is adapted to be fixed on the frame.

In an embodiment of the disclosure, the hanging assembly comprises at least one cylinder, wherein the at least one cylinder is arranged on the frame, and the at least one flexible hanging cable is adapted to be wound around the at least one cylinder.

In an embodiment of the disclosure, the frame has at least one groove, and the at least one cylinder penetrates through the at least one groove and is adapted to be fixed at a plurality of different positions of the at least one groove.

In an embodiment of the disclosure, the number of the at least one groove is plural, and the at least one cylinder selectively penetrates through at least one of the grooves.

In an embodiment of the disclosure, the number of the at least one first fixing component is two, the number of the at least one flexible hanging cable is two, and the two flexible hanging cables are respectively connected to the two first fixing components.

In an embodiment of the disclosure, the frame comprises two sub-frames separated from each other, and the two first fixing components are respectively fixed on the two sub-frames.

In an embodiment of the disclosure, the hanging assembly comprises at least one auxiliary alignment sheet, wherein the at least one auxiliary alignment sheet has a plurality of alignment marks, when the at least one auxiliary alignment sheet covers a fixing structure at the fixed position and the two frames are arranged at any two of the alignment marks, the at least one auxiliary alignment sheet is adapted to be marked in at least one locking hole of each frame, the fixing structure is adapted to be drilled at the fixed position according to the mark of the at least one auxiliary alignment sheet, and each frame is adapted to be assembled to the fixing structure according to the hole drilled in the fixing structure.

In an embodiment of the disclosure, the at least one first fixing component comprises a plate body and a cover body, and the plate body and the cover body are adapted to be combined to clamp the at least one flexible hanging cable between the plate body and the cover body.

In an embodiment of the disclosure, the plate body has a plurality of bumps, the cover body has a plurality of openings, the bumps are respectively embedded in the openings, and the at least one flexible hanging cable is wound around each bump.

The display apparatus of the disclosure comprises at least one display device and at least one hanging assembly. The hanging assembly comprises at least one flexible hanging cable, at least one first fixing component and a frame. The flexible hanging cable comprises a power wire and a hanging wire combined with each other. The first fixing component is connected to the flexible hanging cable and adapted to be fixed at a fixed position. The frame is adapted to be fixed at the fixed position, wherein the at least one first fixing component is adapted to be fixed on the frame.

In an embodiment of the disclosure, the power wire and the hanging wire are coaxially arranged.

In an embodiment of the disclosure, the power wire is coated by the hanging wire.

In an embodiment of the disclosure, the structural strength of the hanging wire is greater than the structural strength of the power wire.

In an embodiment of the disclosure, the flexible hanging cable comprises a protection layer, and the protection layer coats the power wire and the hanging wire.

In an embodiment of the disclosure, the number of the at least one hanging assembly is plural, the number of the at least one display device is plural, and the flexible hanging cables of the hanging assemblies are adapted to be respectively connected to the display devices, so that the display devices are connected in parallel with each other through the flexible hanging cables of the hanging assemblies.

In an embodiment of the disclosure, the structural strength of the hanging wire is greater than the structural strength of the protection layer.

In an embodiment of the disclosure, the at least one hanging assembly includes at least one second fixing component connected to the at least one flexible hanging cable and adapted to be fixed on the at least one display device.

Based on the above, in the display apparatus of the disclosure, flexible hanging cables formed by integrating power wires and hanging wires are used for hanging display devices, and the flexible hanging cables have the functions of hanging and power transmission, so that power wires independent of the flexible hanging cables do not need to be additionally arranged. Furthermore, non-flexible pipes having a large pipe diameter are not needed for hanging the displays and hiding the cables, so that the display devices can be mounted aesthetically.

In order to make the aforementioned advantages of the disclosure comprehensible, embodiments accompanied with figures are described in detail below.

DESCRIPTION OF THE EMBODIMENTS

Figure 1:
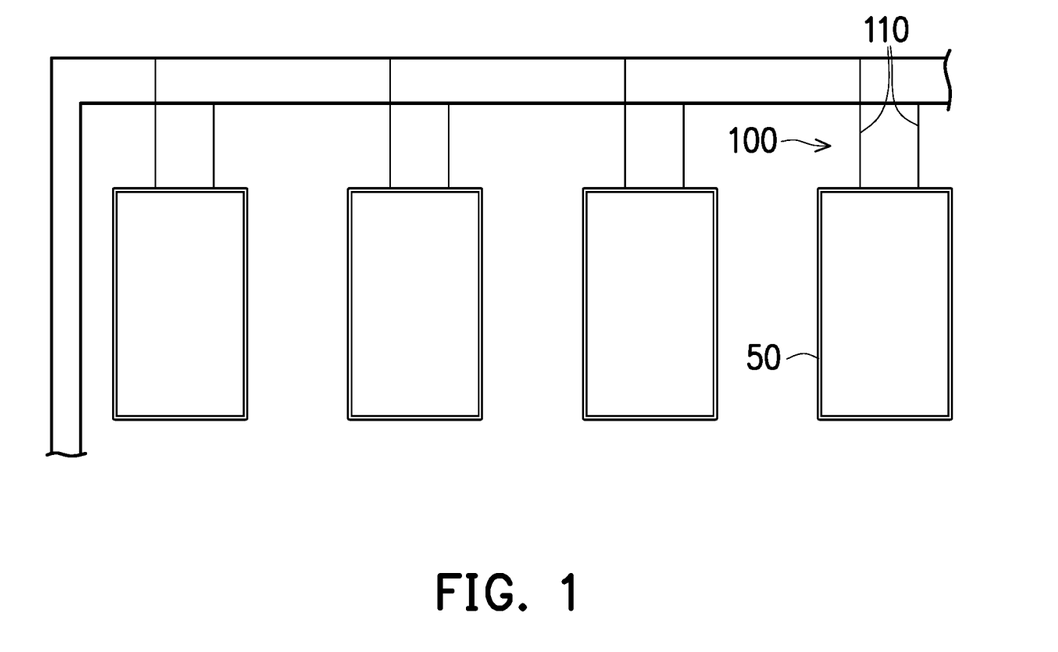
FIG. 1 is a schematic view of a plurality of hanging assemblies applied to a plurality of display devices according to an embodiment of the disclosure.
Figure 2:
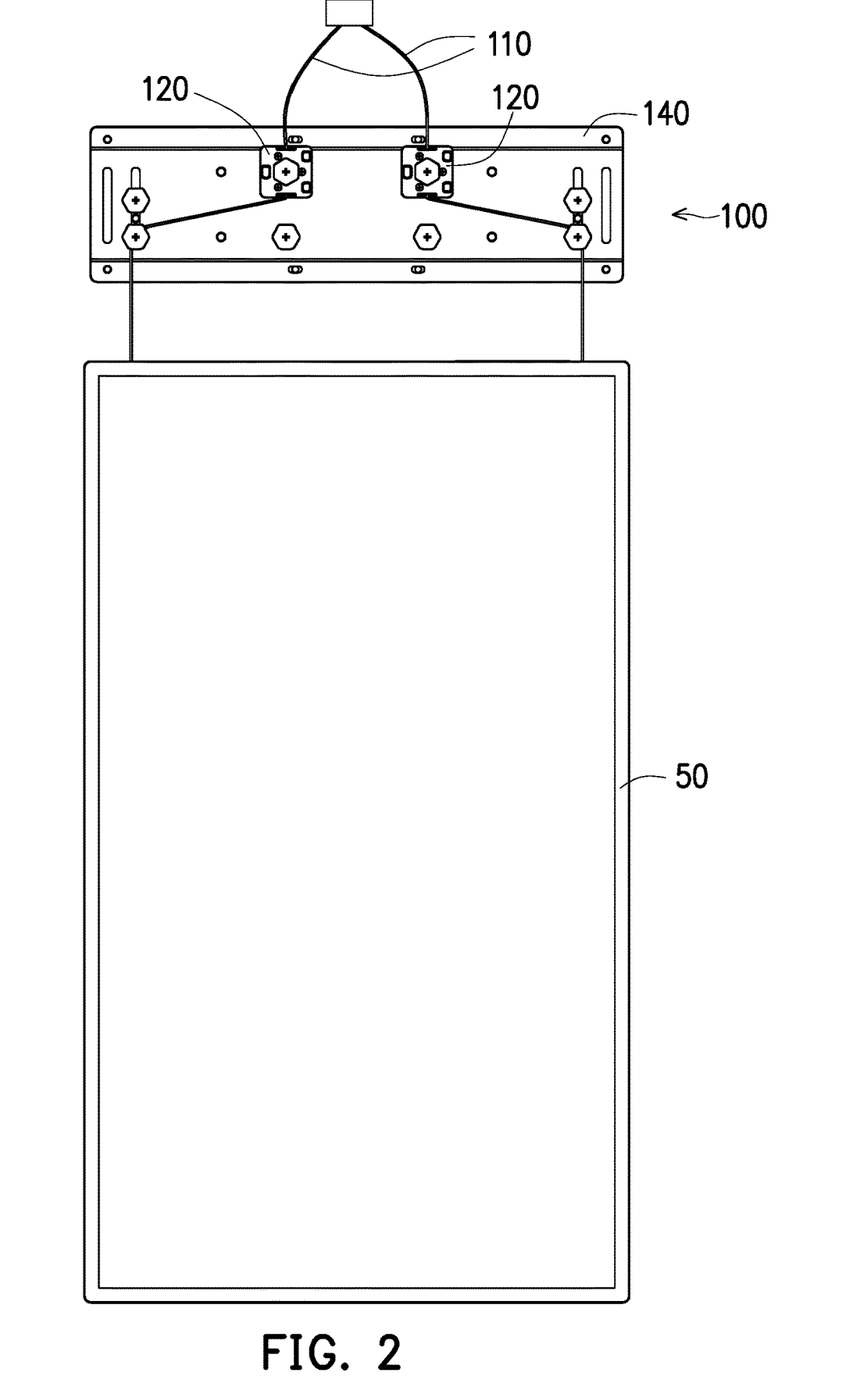
FIG. 2 is a front view of a display apparatus composed of a single hanging assembly and a single display device in FIG. 1.
Figure 3:
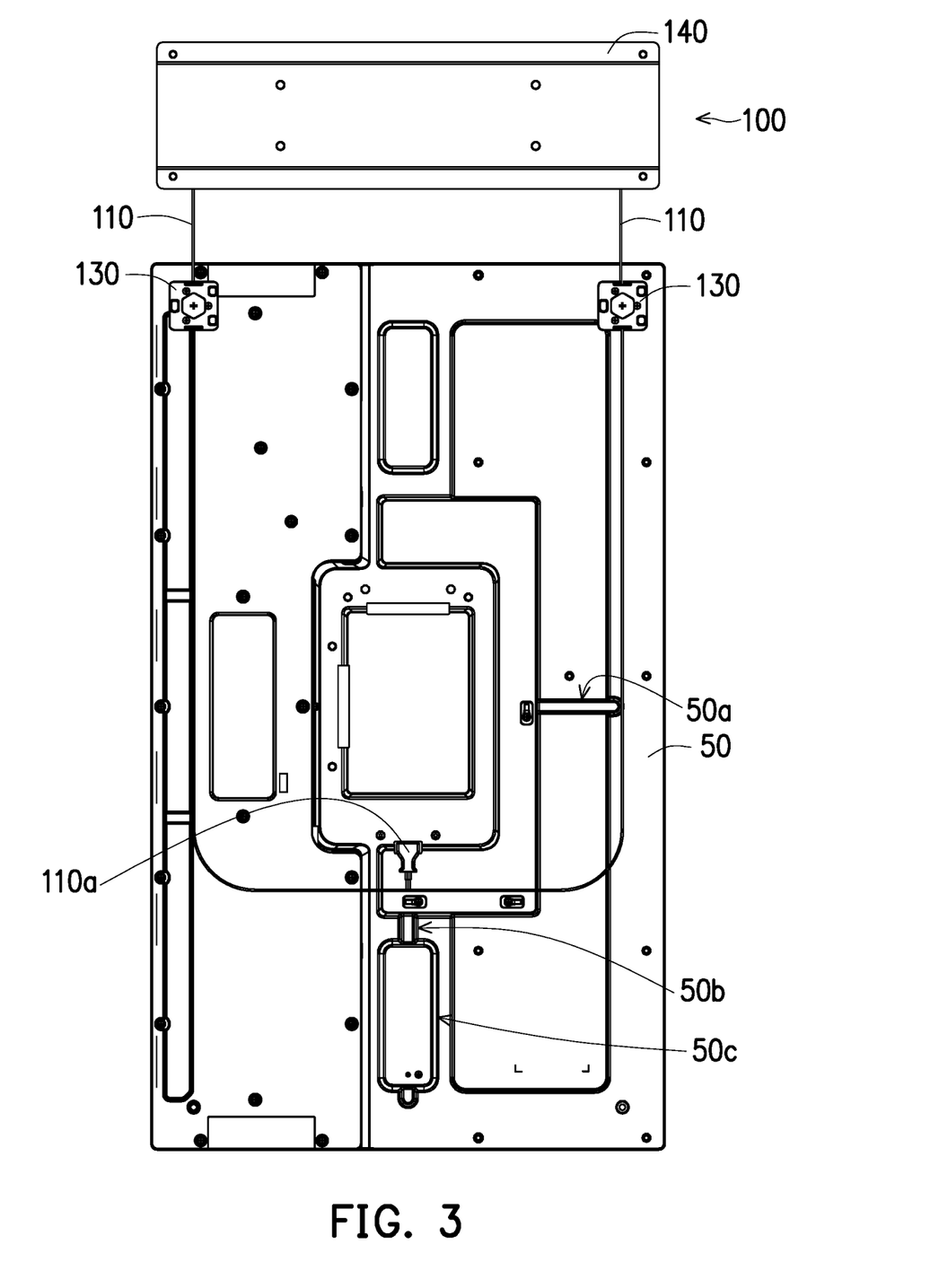
FIG. 3 is a rear view of a display apparatus composed of a single hanging assembly and a single display device in FIG. 1.
Figure 4:
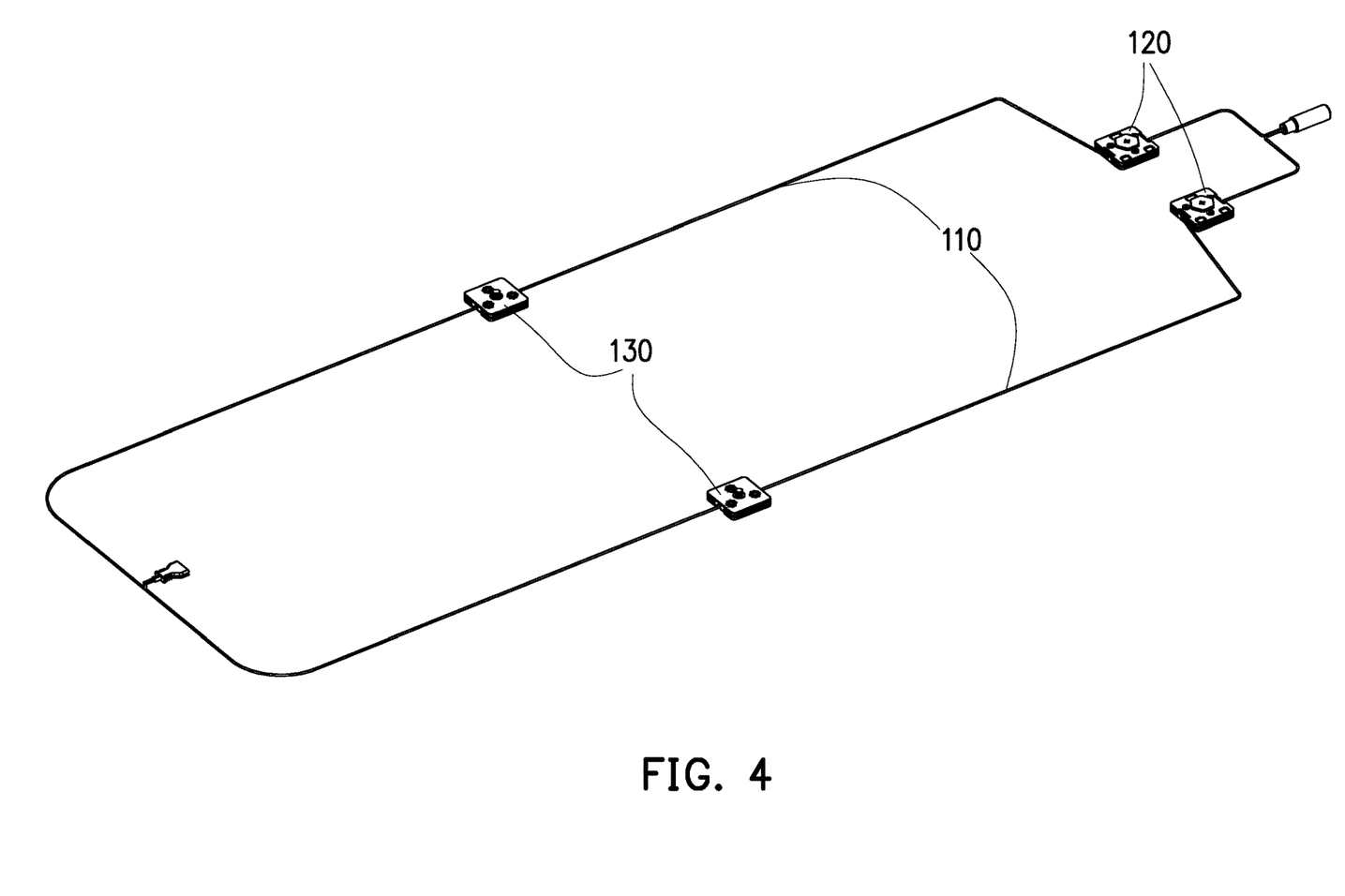
FIG. 4 shows partial components of a hanging assembly in FIG. 2.

FIG. 1 is a schematic view of a plurality of hanging assemblies applied to a plurality of display devices according to an embodiment of the disclosure. FIG. 2 is a front view of a display apparatus composed of a single hanging assembly and a single display device in FIG. 1. FIG. 3 is a rear view of a display apparatus composed of a single hanging assembly and a single display device in FIG. 1. FIG. 4 shows partial components of a hanging assembly in FIG. 2. Referring to FIG. 1 to FIG. 4, each hanging assembly 100 in the present embodiment comprises at least one flexible hanging cable 110 (two flexible hanging cables 110 are shown), at least one first fixing component 120 (two first fixing components 120 are shown) and at least one second fixing component 130 (two second fixing components 130 are shown). The first fixing components 120 are connected to the flexible hanging cables 110 and adapted to be fixed on a fixing structure (such as a ceiling or a wall surface) at a fixed position. The second fixing components 130 are connected to the flexible hanging cables 110 and adapted to be fixed on a display device 50 at a hanging position, so that the display device 50 is hung to the fixing structure by the hanging assembly 100. The display devices 50 and the hanging assemblies 100 form a display apparatus. The flexible hanging cables 110 of the hanging assemblies 100 are adapted to be respectively connected to the display devices 50, so that the display devices 50 are connected in parallel with each other through the flexible hanging cables 110 of the hanging assemblies 100. In other embodiments, the display apparatus may only comprise a display device 50 and a corresponding hanging assembly 100, but the present invention is not limited thereto.

Figure 5:
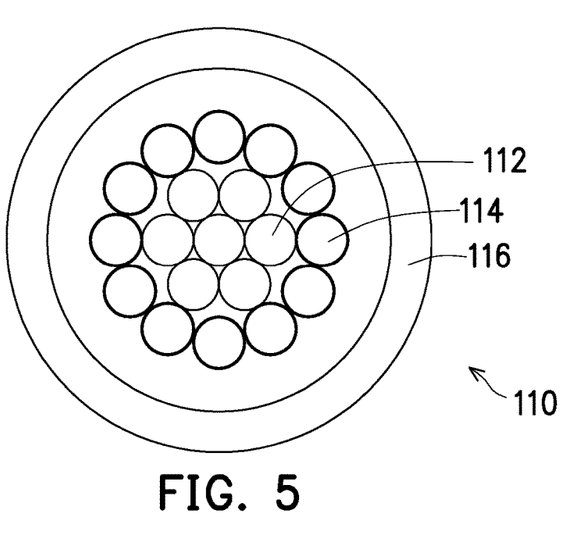
FIG. 5 is a cross-sectional schematic view of a flexible hanging cable in FIG. 1.

FIG. 5 is a cross-sectional schematic view of a flexible hanging cable in FIG. 1. As shown in FIG. 5, the flexible hanging cable 110 in the present embodiment comprises at least one power wire 112 and at least one hanging wire 114 combined with each other, and comprises a protection layer 116. The power wire 112 is adapted to be electrically connected to the corresponding display device 50. In a single hanging assembly 100, the power wires 112 of the two flexible hanging cables 110 may be, for example, respectively a positive electrode and a negative electrode or respectively a positive electrode and a grounding wire. The power wire 112 and the hanging wire 114 are coaxially arranged, the power wire 112 is coated by the hanging wire 114, and the protection layer 116 coats the power wire 112 and the hanging wire 114. The hanging wire 114 may be, for example, a steel cable or other cables made of materials with high structural strength, so that the structural strength of the hanging wire 114 is greater than the structural strength of the power wire 112 and greater than the structural strength of the protection layer 116. Specifically, the maximum load of the hanging wire 114 may be at least four times the weight of each display device 50.

Based on the above, in the present embodiment, the flexible hanging cables 110 formed by integrating the power wires 112 and the hanging wires 114 are used for hanging the display devices 50, and the flexible hanging cables 110 have the functions of hanging and power transmission, so that power wires independent of the flexible hanging cables 110 do not need to be additionally arranged. Furthermore, non-flexible pipes having a large pipe diameter are not needed for hanging the displays 50 and hiding the cables, so that the display devices 50 can be mounted aesthetically.

As shown in FIG. 2 and FIG. 3, the hanging assembly 100 in the present embodiment comprises a frame 140. In the processes of mounting the hanging assembly 100 and the display device 50, firstly, the frame 140 can be fixed on the fixing structure, then, the first fixing components 120 connected with the flexible hanging cables 110 are fixed on the frame 140, and the second fixing components 130 connected with the flexible hanging cables 110 are fixed on the back of the display device 50. The disclosure does not limit the order of the above mounting steps.

Figure 6:
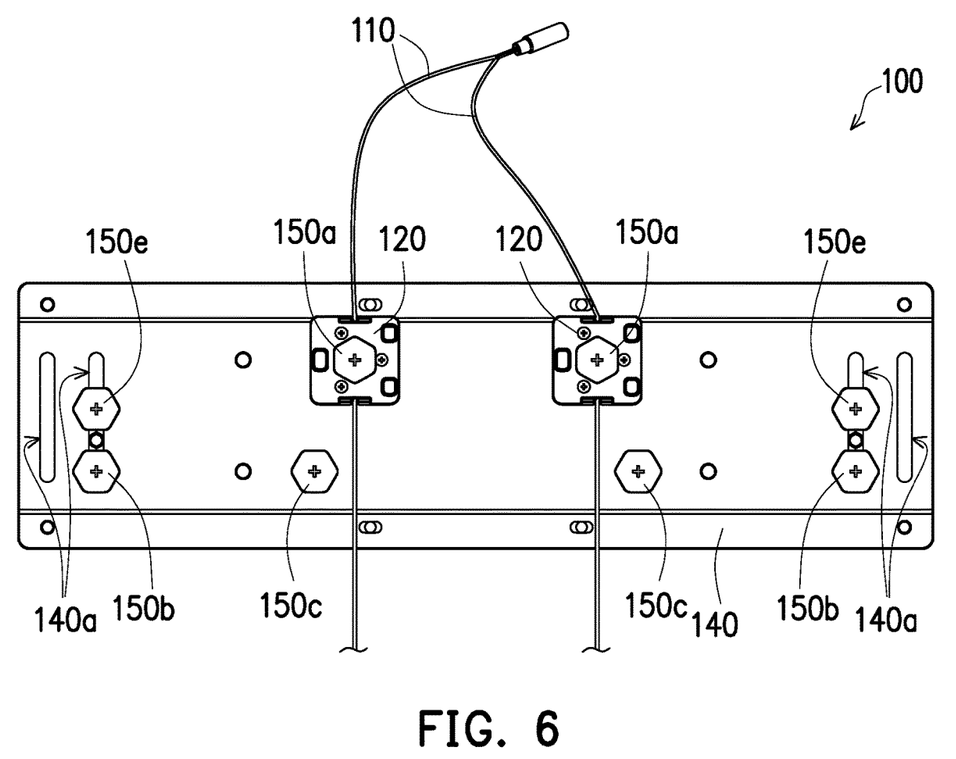
FIG. 6 is a partial front view of a hanging assembly in FIG. 2.

FIG. 6 is a partial front view of a hanging assembly in FIG. 2. Referring to FIG. 6, the hanging assembly 100 in the present embodiment comprises at least one cylinder (a plurality of cylinders 150a, 150b, 150c and 150e are shown) arranged on the frame 140. The cylinders 150a may be, for example, screws and are used for locking the first fixing components 120 on the frame 140. The cylinders 150b and the cylinders 150c may be, for example, screws and are used for winding the flexible hanging cables 110. The mode of winding the flexible hanging cables 110 around the cylinders 150b and the cylinders 150c is described below with reference to the drawings.

Figure 7:
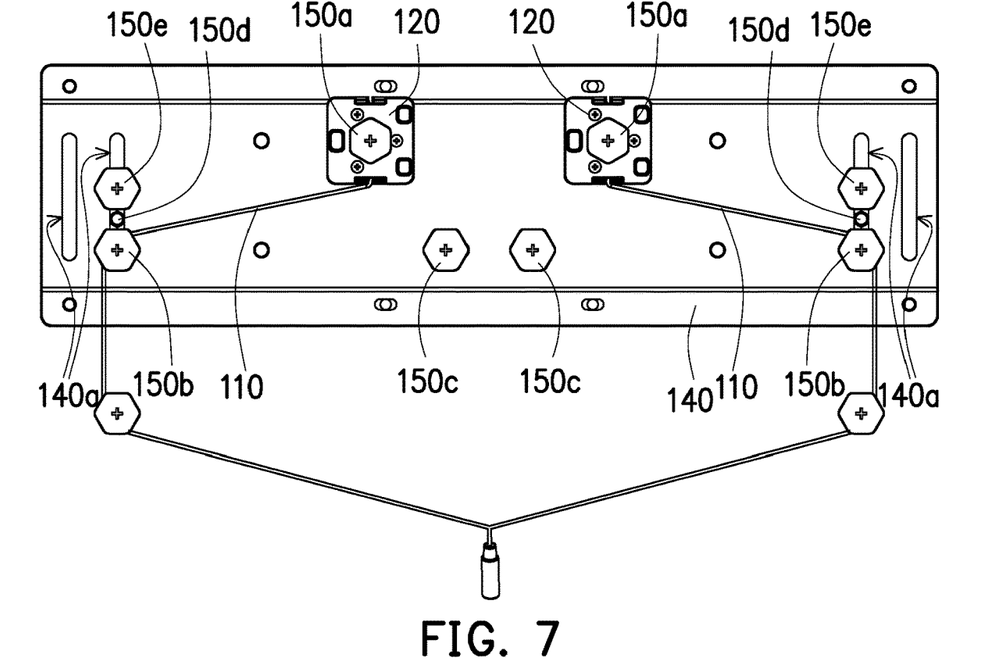
FIG. 7 and FIG. 8 show flexible hanging cables which are respectively wound around cylinders in different modes.
Figure 8:
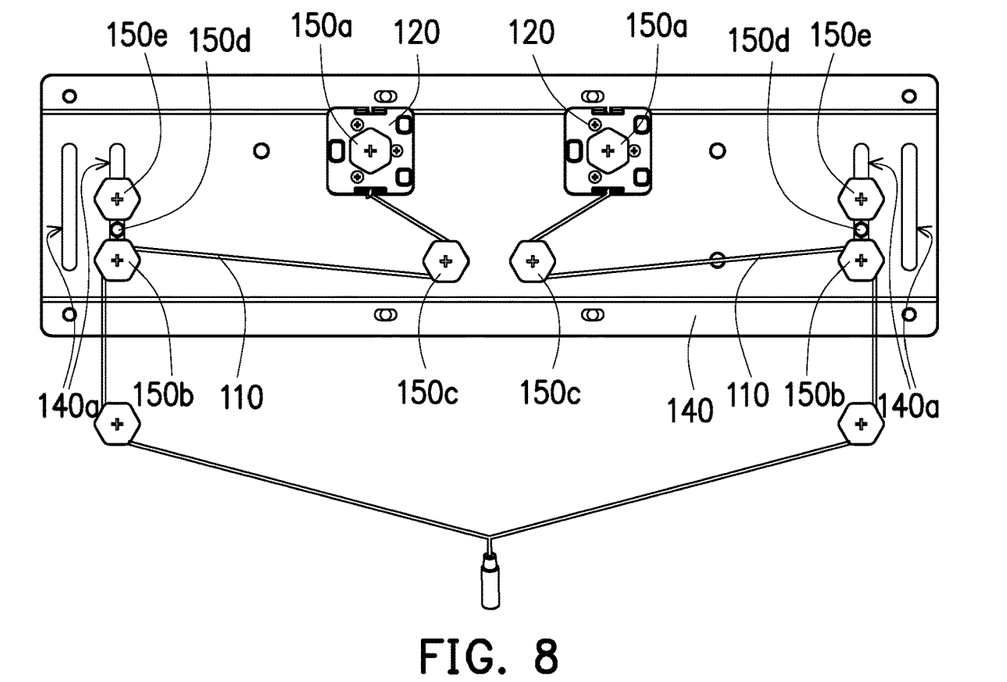

FIG. 7 and FIG. 8 show flexible hanging cables which are respectively wound around cylinders in different modes. According to the hanging requirement, a user can wind the flexible hanging cables 110 around the cylinders 150b but not wind the flexible hanging cables 110 around the cylinders 150c, as shown in FIG. 7, so that the flexible hanging cables 110 have a large hanging length in a vertical direction. The user also can wind the flexible hanging cables 110 around the cylinders 150b and the cylinders 150c, as shown in FIG. 8, so that the flexible hanging cables 110 have a small hanging length in the vertical direction. Accordingly, the hanging height of the display device 50 in the vertical direction can be adjusted.

Figure 9:
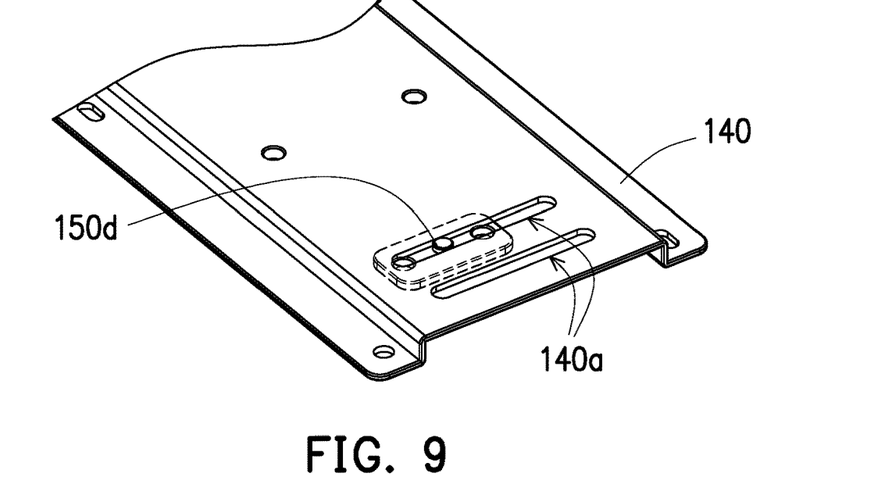
FIG. 9 is a three-dimensional view of a slide block and a frame in FIG. 8.
Figure 10:
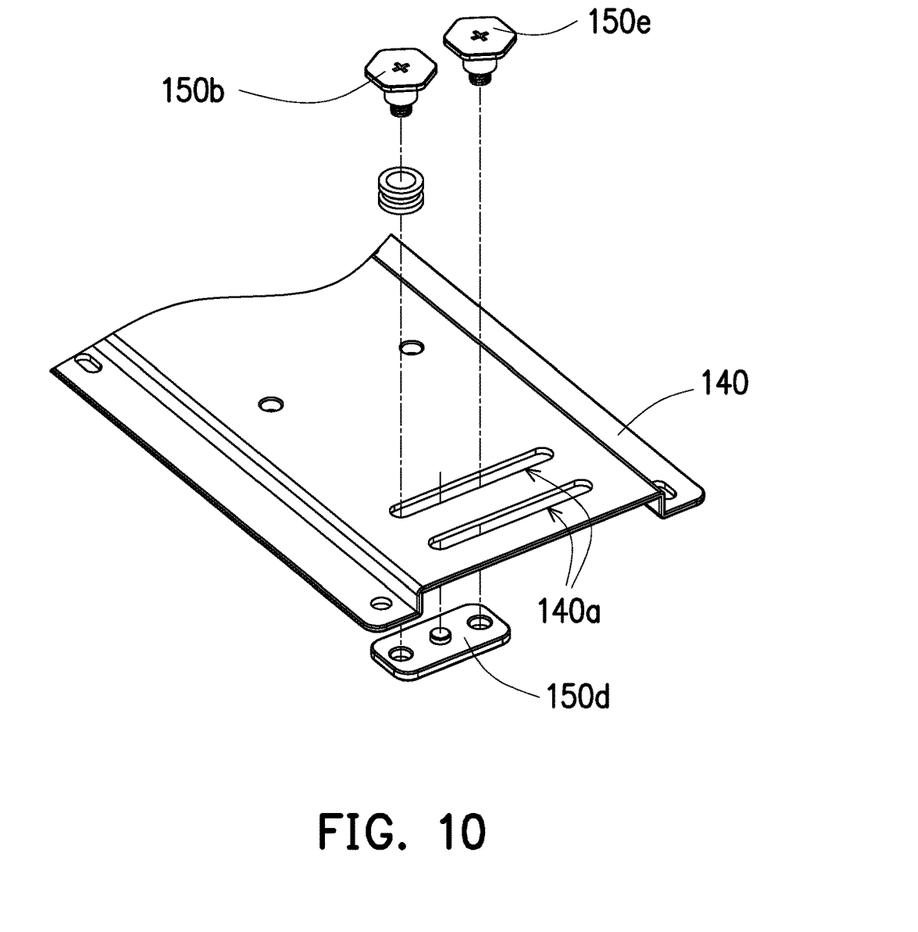
FIG. 10 is an exploded view of cylinders, a slide block and a frame in FIG. 8.
Figure 11:
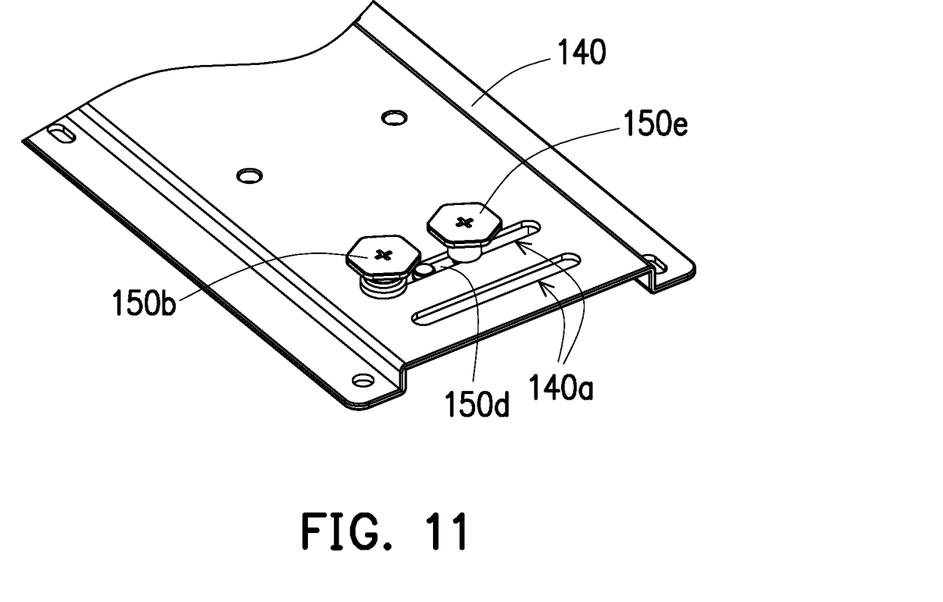
FIG. 11 and FIG. 12 show cylinders which are respectively located at different positions of grooves.
Figure 12:
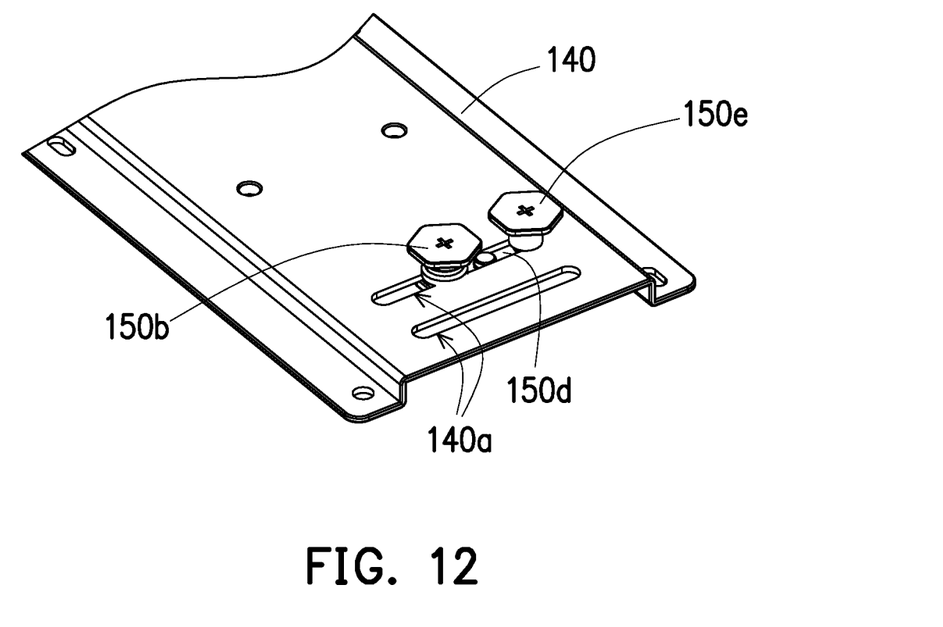

Furthermore, the frame 140 in the present embodiment has at least one groove 140a (a plurality of grooves 140a are shown), and the cylinders 150b penetrate through the grooves 140a to be fixed. FIG. 9 is a three-dimensional view of a slide block and a frame in FIG. 8. FIG. 10 is an exploded view of cylinders, a slide block and a frame in FIG. 8. FIG. 11 and FIG. 12 show cylinders which are respectively located at different positions of grooves. In detail, as shown in FIG. 9 and FIG. 10, the hanging assembly 100 further comprises a slide block 150d, and the cylinder 150b and the slide block 150d are respectively located at two opposite sides of the groove 140a of the frame 140 and locked to each other. The user can slightly loosen the locking between the cylinder 150b and the slide block 150d, so that the cylinder 150b and the slide block 150d can move along the groove 140a relative to the frame 140 to different positions as shown in FIG. 11 and FIG. 12. After the cylinder 150b and the slide block 150d move to the positions desired by the user, the user can lock the cylinder 150b and the slide block 150d to fix the positions of the cylinder 150b and the slide block 150d. As mentioned above, the positions of the cylinders 150b in the corresponding grooves 140a are changed, and the level of the display device 50 can be adjusted by the relative positions of the two cylinders 150b (left and right cylinders 150b as shown in FIG. 6) in the vertical direction. In the present embodiment, as shown in FIG. 10, a cylinder 150e is used as an auxiliary fixing screw and penetrates through the groove 140a to be locked to the slide block 150d, thereby preventing the cylinder 150b and the slide block 150d from being unintentionally separated from the frame 140 in the process of adjusting the positions of the cylinder 150b and the slide block 150d by the user. In detail, the cylinder 150e normally penetrates through the groove 140a to be locked to the slide block 150d. The locking relation can limit the slide block 150d from being separated from the frame 140, but does not limit the relative slide between the slide block 150d and the frame 140. When the user wants to adjust the positions of the cylinder 150b and the slide block 150d, the user can loosen the locking of the cylinder 150b to the slide block 150d, so that the slide block 150d can move along the groove 140a to the desired position, and then, the cylinder 150b is locked. In the adjusting process, by the locking relation between the cylinder 150e and the slide block 150d, the slide block 150d can be prevented from being unintentionally separated from the frame 140.

As shown in FIG. 9 to FIG. 12, in the present embodiment, a plurality of grooves 140a (two grooves 140a are shown) are formed for a single cylinder 150b, and the cylinder 150b selectively penetrates through one of the grooves 140a to be adapted to display devices 50 of different sizes or different mounting modes. In other embodiments, the frame 140 may have a greater number of grooves 140a to improve the universality.

Figure 13:
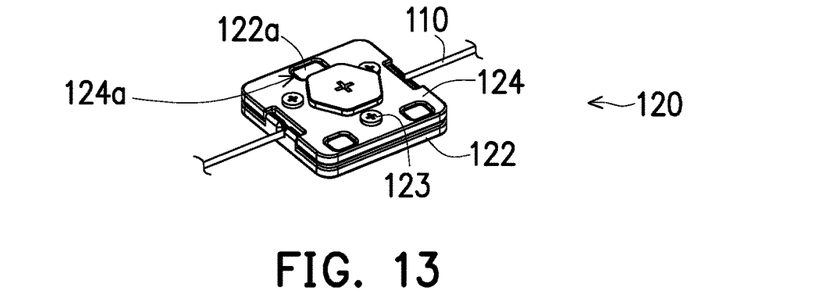
FIG. 13 is a three-dimensional view of a first fixing component and flexible hanging cables in FIG. 2.
Figure 14:
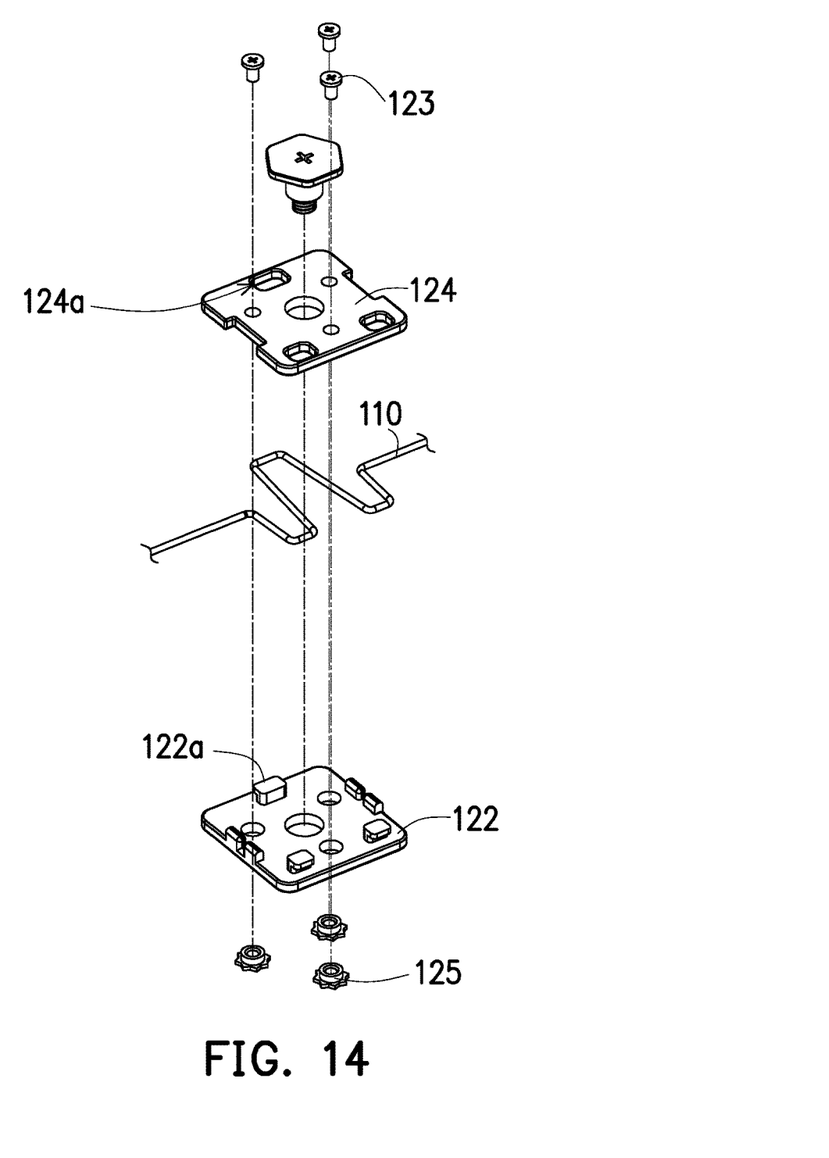
FIG. 14 is an exploded view of a first fixing component and a flexible hanging cable in FIG. 13.

FIG. 13 is a three-dimensional view of a first fixing component and flexible hanging cables in FIG. 2. FIG. 14 is an exploded view of a first fixing component and a flexible hanging cable in FIG. 13. Referring to FIG. 13 and FIG. 14, the first fixing component 120 in the present embodiment comprises a plate body 122 and a cover body 124, the plate body 122 and the cover body 124 are adapted to be combined by mutual locking of screws 123 and nuts 125 to clamp the flexible hanging cable 110 between the plate body 122 and the cover body 124. Further, the plate body 122 has a plurality of bumps 122a, the cover body 124 has a plurality of openings 124a, the bumps 122a are respectively embedded in the openings 124a, and the flexible hanging cable 110 is wound around each bump 122a, so that the flexible hanging cable 110 is firmly fixed to the first fixing component 120.

Figure 15:
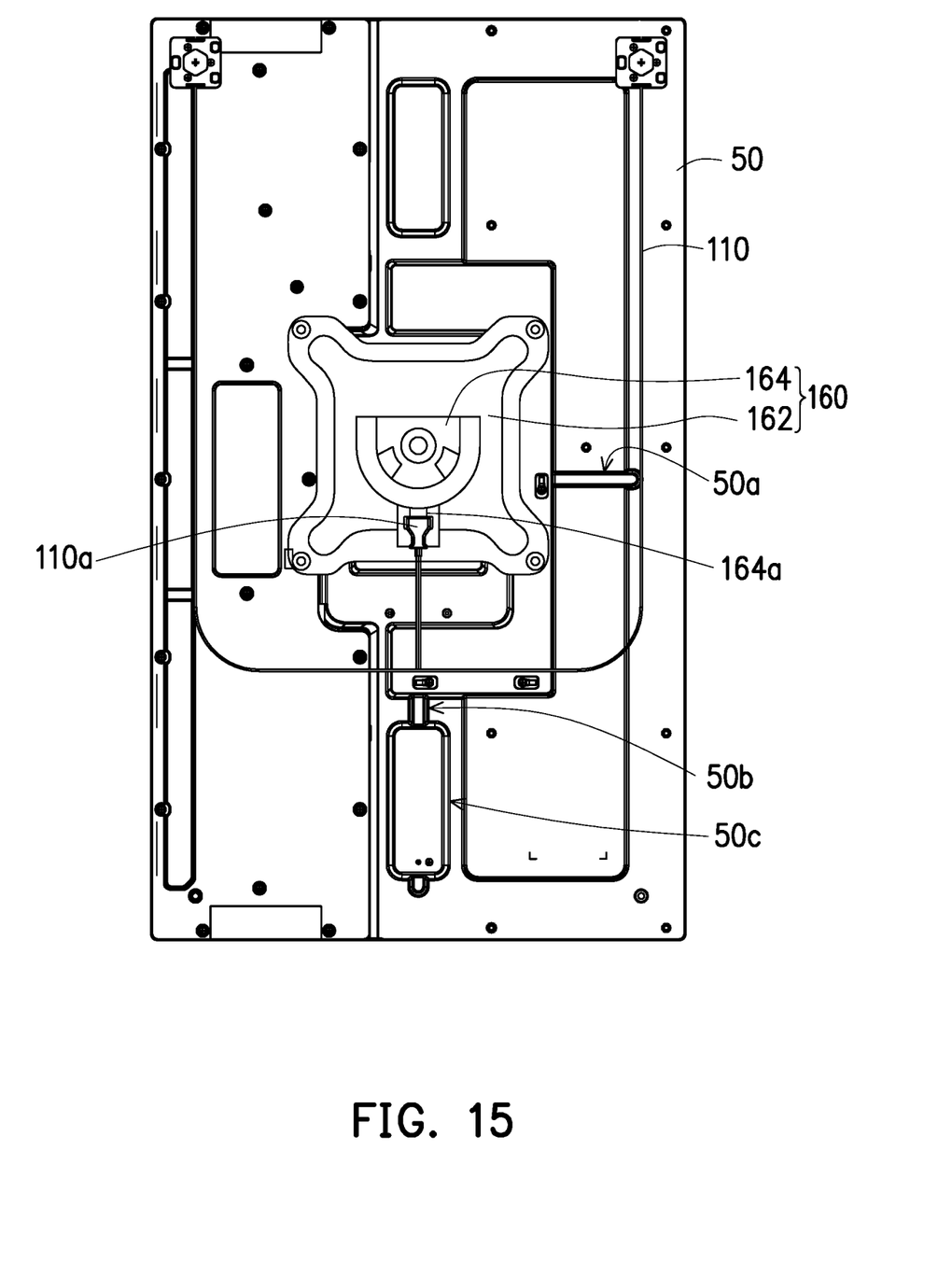
FIG. 15 shows a display device in FIG. 3 provided with a power adapter module.
Figure 16:
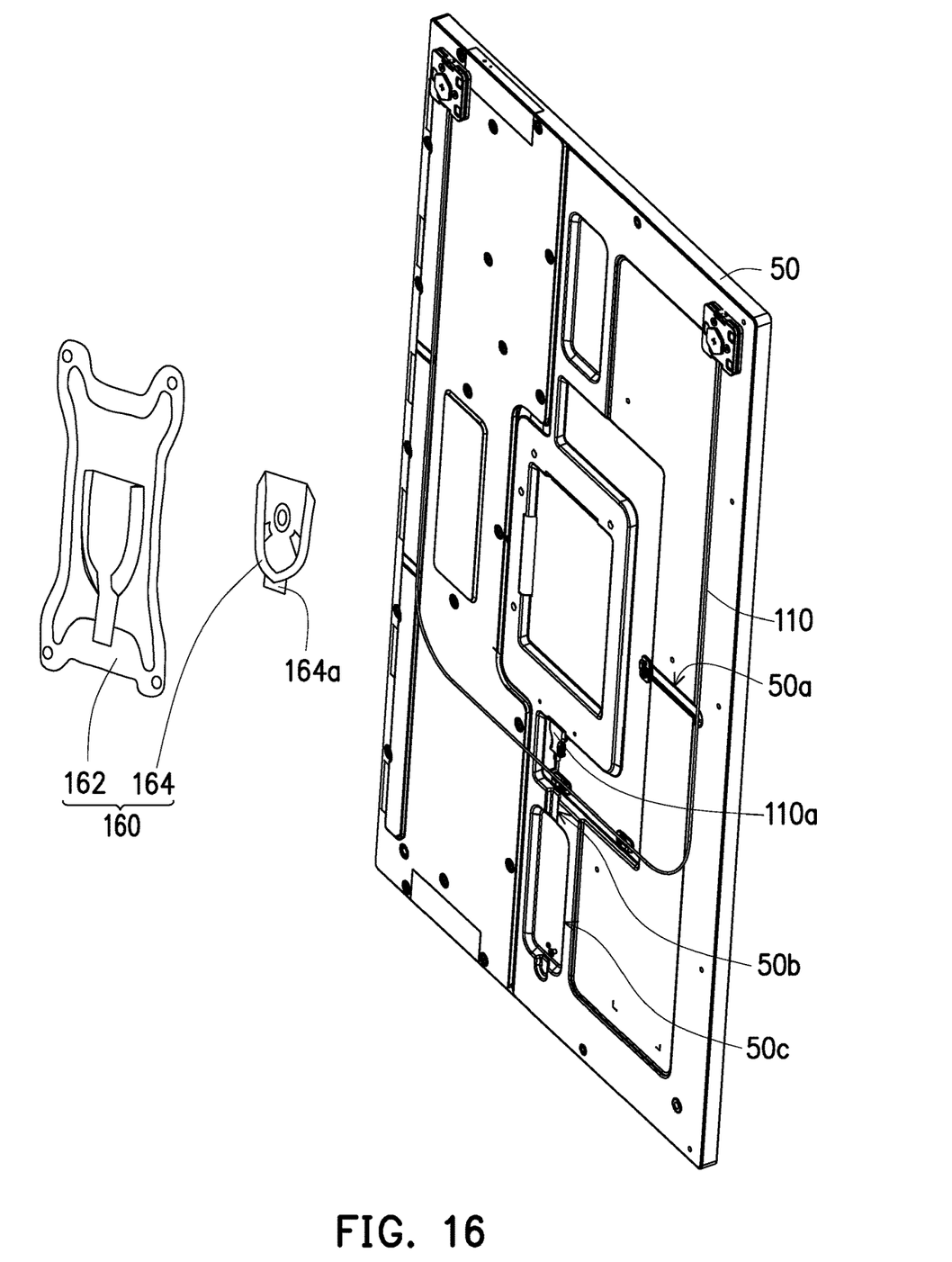
FIG. 16 is an exploded view of a display device and a power adapter module in FIG. 15.

FIG. 15 shows a display device in FIG. 3 provided with a power adapter module. FIG. 16 is an exploded view of a display device and a power adapter module in FIG. 15. In the present embodiment, the hanging assembly 100 (shown in FIG. 3) may further comprise a power adapter module 160, and the power adapter module 160 is adapted to be arranged on the back of the display device 50, so that the flexible hanging cable 110 can be electrically connected to the display device 50 through the power adapter module 160. Specifically, the power adapter module 160 comprises a power adapter plate 162 and a power adapter 164, the power adapter plate 162 is adapted to be fixed on the back of the display device 50, and the power adapter 164 is connected to the power adapter plate 162 and is adapted to the flexible hanging cable 110 for inserting. In detail, the size of a connector 164a of the power adapter 164 corresponds to the size of a connector 110a of the flexible hanging cable 110, so that the connector 164a and the connector 110a can be inserted to each other. Furthermore, grooves 50a, 50b and 50c of the display device 50 can be used for mounting wires and electrical assemblies connected to the display device 50, and the wires extend to the power adapter module 160 to be connected to the power adapter 164, so that the flexible hanging cables 110 can be electrically connected to the display device 50 through the power adapter 164, the wires and the electrical assemblies.

Figure 17:
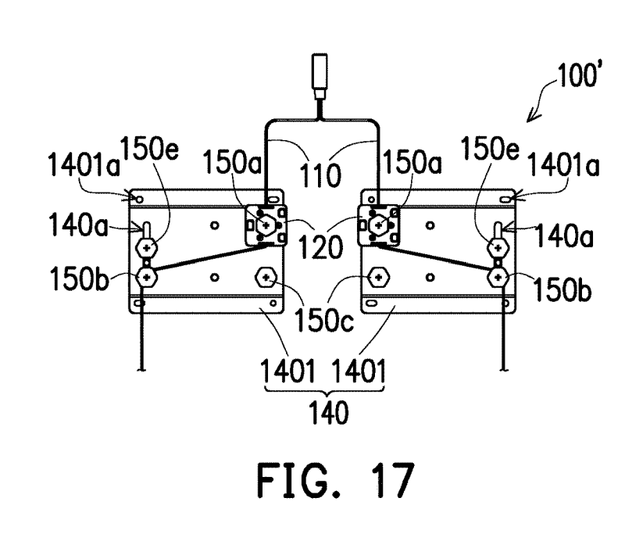
FIG. 17 shows a frame in FIG. 6 divided into two independent sub-frames.

FIG. 17 shows a frame in FIG. 6 divided into two independent sub-frames. As shown in FIG. 17, the frame 140 can be designed to comprise two sub-frames 1401 separated from each other, and two first fixing components 120 are respectively fixed on the two sub-frames 1401. Therefore, by changing the relative positions of the two sub-frames 1401, a hanging assembly 100' is suitable for more display devices of different sizes or different mounting modes. Details are described below.

Figure 18:
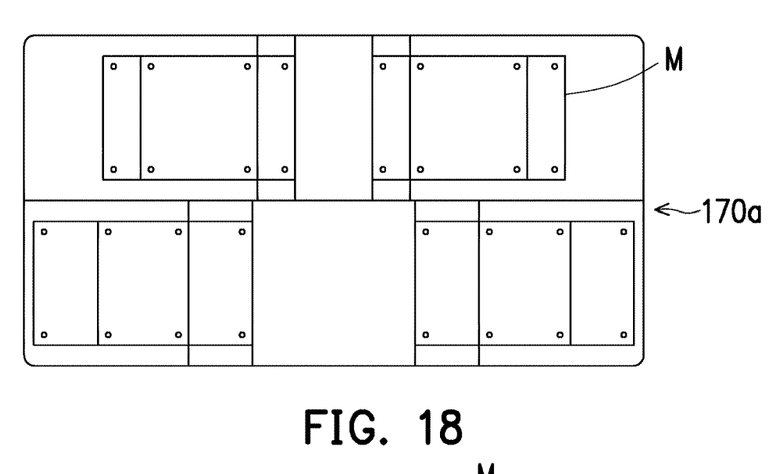
FIG. 18 and FIG. 19 show two auxiliary alignment sheets according to an embodiment of the disclosure.
Figure 19:
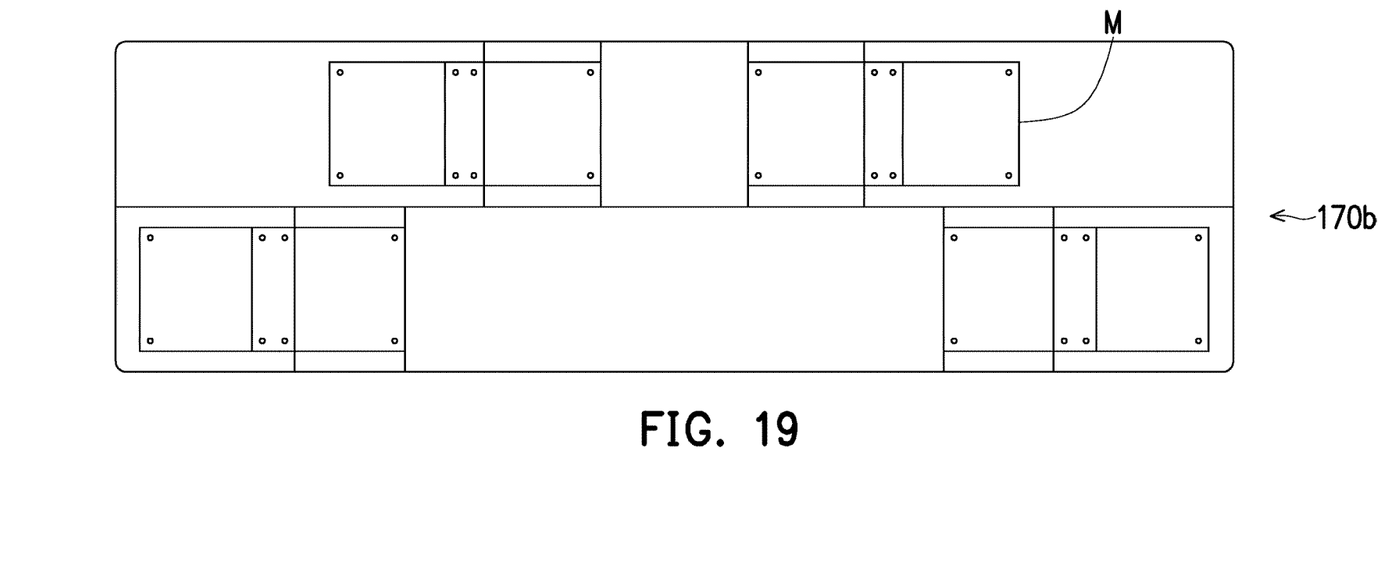
Figure 20A:
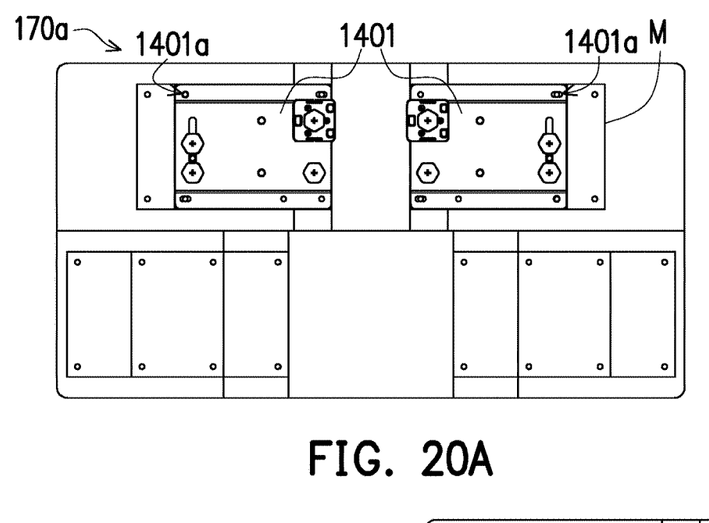
FIG. 20A to FIG. 20E show sub-frames in FIG. 17 mounted according to alignment marks of auxiliary alignment sheets.
Figure 20B:
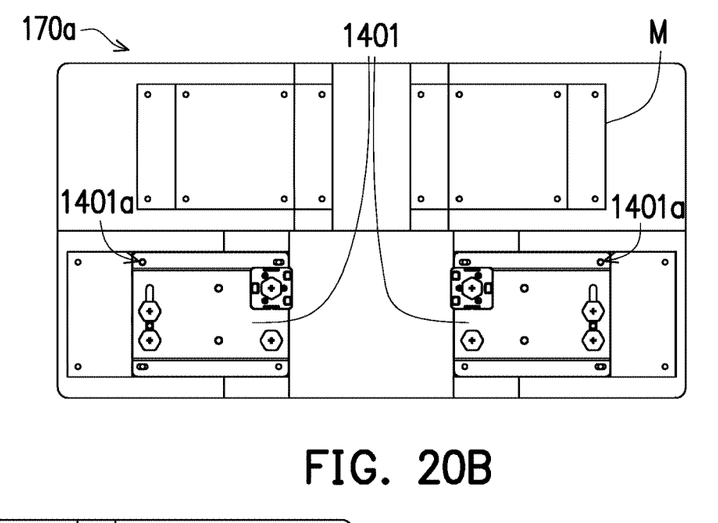
Figure 20C:
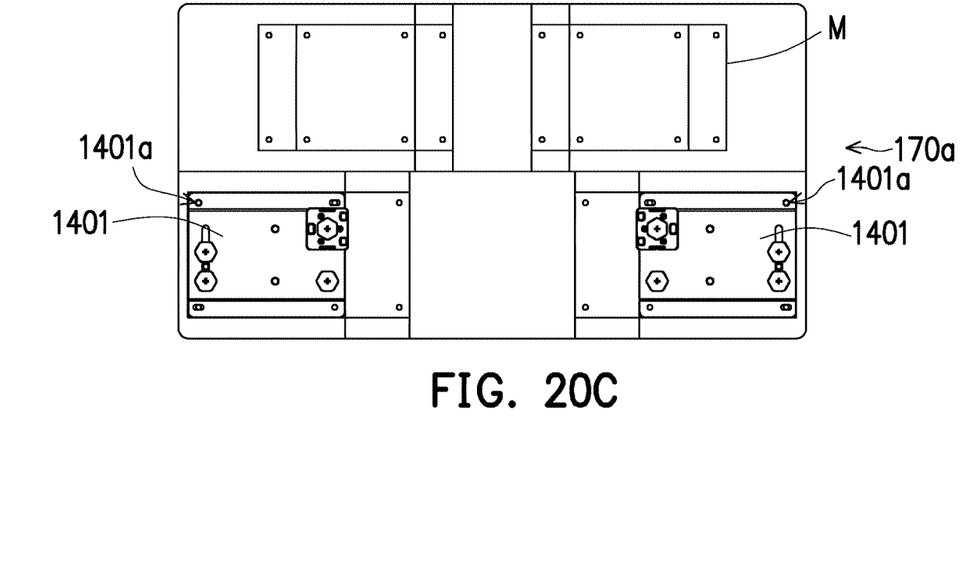
Figure 20D:
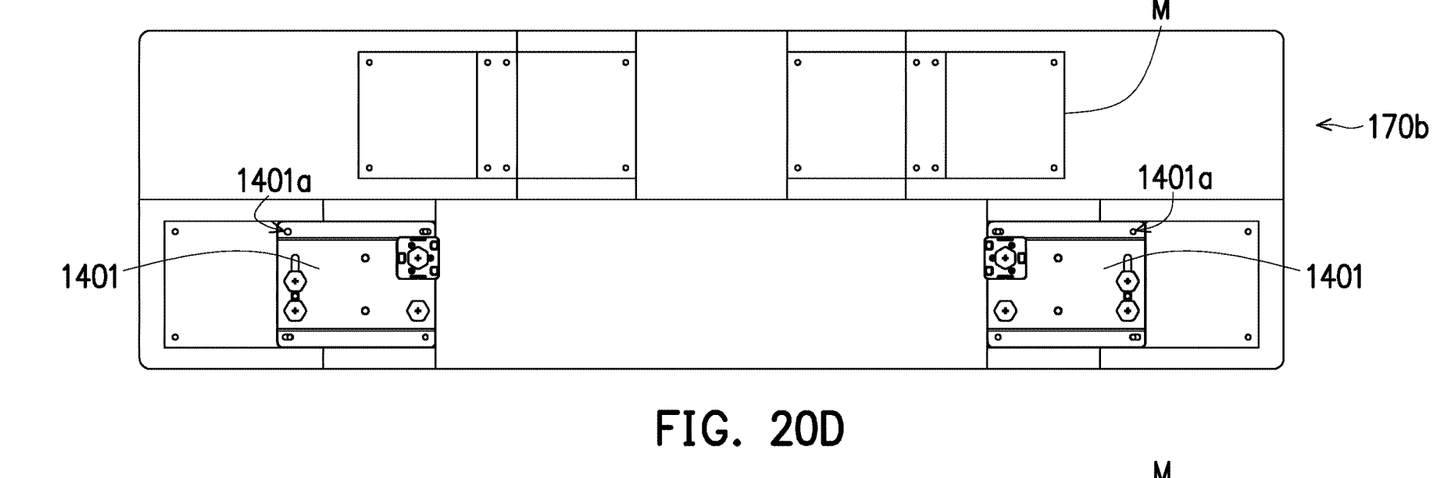
Figure 20E:
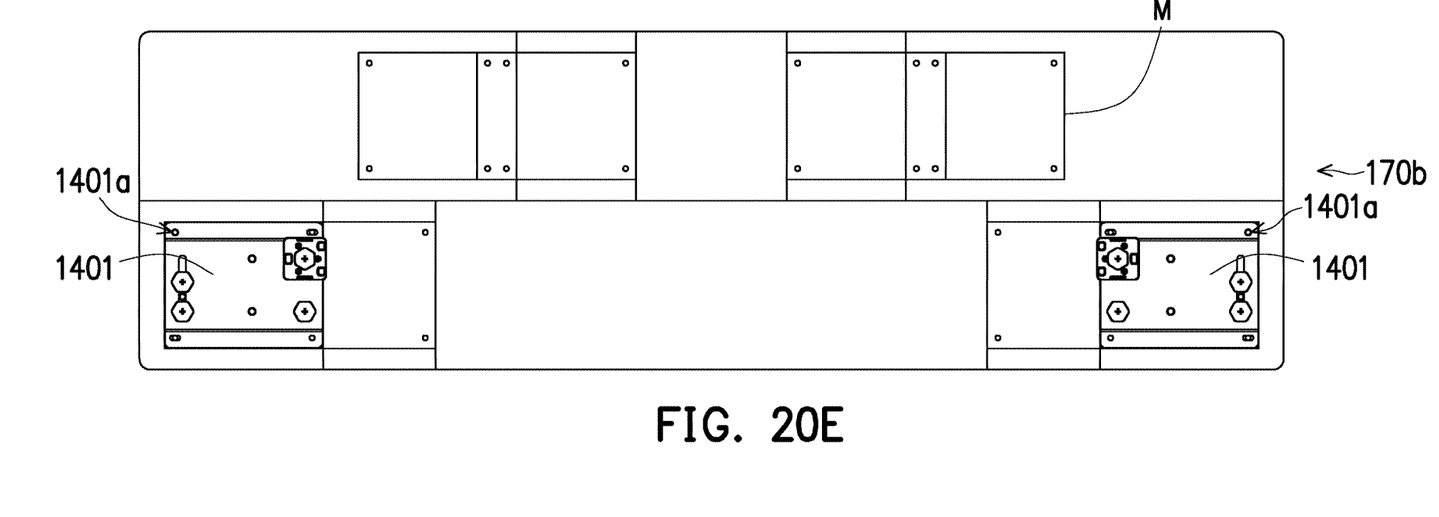

FIG. 18 and FIG. 19 show two auxiliary alignment sheets according to an embodiment of the disclosure. FIG. 20A to FIG. 20E show sub-frames in FIG. 17 mounted according to alignment marks of auxiliary alignment sheets. The hanging assembly 100' may comprise auxiliary alignment sheets 170a and 170b as shown in FIG. 18 and FIG. 19. The auxiliary alignment sheets 170a and 170b have a plurality of alignment marks M, and the auxiliary alignment sheet 170a or the auxiliary alignment sheet 170b is adapted to cover the fixing structure (such as a wall surface) at the fixed position to provide an auxiliary alignment function on the wall surface by the alignment mark M, so that the two sub-frames 1401 are adapted to be assembled to the fixing structure at different relative positions according to the alignment marks M of the auxiliary alignment sheet 170a or the auxiliary alignment sheet 170b as shown in FIG. 20A to FIG. 20E. For example, the user firstly sticks the auxiliary alignment sheet 170a or the auxiliary alignment sheet 170b to a preset position on the wall surface, then puts the two sub-frames 1401 at the selected alignment marks M, and marks the auxiliary alignment sheet 170a or the auxiliary alignment sheet 170b in the locking holes 1401a of the sub-frames 1401. Then, the user moves the sub-frames 1401 away from the auxiliary alignment sheet 170a or the auxiliary alignment sheet 170b, and drills the wall surface at the mark of the auxiliary alignment sheet 170a or the auxiliary alignment sheet 170b. Then, the user removes the auxiliary alignment sheet 170a or the auxiliary alignment sheet 170b from the wall surface, and screws the sub-frames 1401 in the holes drilled in the wall surface, thereby completing the mounting of the sub-frames 1401.

In conclusion, in the hanging assembly of the disclosure, flexible hanging cables formed by integrating power wires and hanging wires are used for hanging display devices, and the flexible hanging cables have the functions of hanging and power transmission, so that power wires independent of the flexible hanging cables do not need to be additionally arranged. Furthermore, non-flexible pipes having a large pipe diameter are not needed for hanging the displays and hiding the cables, so that the display devices can be mounted aesthetically.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A hanging assembly, comprising:
at least one flexible hanging cable comprising a power wire and a hanging wire combined with each other;
at least one first fixing component connected to the at least one flexible hanging cable and adapted to be fixed at a fixed position; and
a frame adapted to be fixed at the fixed position, wherein the at least one first fixing component is adapted to be fixed on the frame,
wherein the at least one first fixing component comprises a plate body and a cover body, and the plate body and the cover body are adapted to be combined to clamp the at least one flexible hanging cable between the plate body and the cover body, and
the plate body comprises a plurality of bumps, the cover body comprises a plurality of openings, the bumps are respectively embedded in the openings, and the at least one flexible hanging cable is wound around each of the bumps.

2. The hanging assembly according to claim 1, wherein the power wire and the hanging wire are coaxially arranged.

3. The hanging assembly according to claim 1, wherein the power wire is coated by the hanging wire.

4. The hanging assembly according to claim 1, wherein a structural strength of the hanging wire is greater than a structural strength of the power wire.

5. The hanging assembly according to claim 1, wherein the at least one flexible hanging cable comprises a protection layer, and the protection layer coats the power wire and the hanging wire.

6. The hanging assembly according to claim 5, wherein a structural strength of the hanging wire is greater than a structural strength of the protection layer.

7. The hanging assembly according to claim 1, comprising at least one second fixing component connected to the at least one flexible hanging cable and adapted to be fixed at a hanging position.

8. The hanging assembly according to claim 7, wherein the power wire is adapted to be electrically connected to a display device, and the display device is adapted to be fixed with the at least one second fixing component at the hanging position.

9. The hanging assembly according to claim 8, wherein a maximum load of the hanging wire is at least four times a weight of the display device.

10. The hanging assembly according to claim 8, further comprising a power adapter module, wherein the power adapter module is adapted to be arranged on the display device and electrically connected to the display device, and the at least one flexible hanging cable is adapted to be inserted in the power adapter module.

11. The hanging assembly according to claim 10, wherein the power adapter module comprises a power adapter plate and a power adapter, the power adapter plate is adapted to be fixed on the display device, and the power adapter is connected to the power adapter plate and electrically connected to the display device and is adapted to be inserted by the at least one flexible hanging cable.

12. The hanging assembly according to claim 11, wherein the number of the at least one first fixing component are two, the number of the at least one flexible hanging cable are two, and the two flexible hanging cables are respectively connected to the two first fixing components.

13. The hanging assembly according to claim 12, wherein the frame comprises two sub-frames separated from each other, and the two first fixing components are respectively fixed on the two sub-frames.

14. The hanging assembly according to claim 13, further comprising at least one auxiliary alignment sheet, wherein the at least one auxiliary alignment sheet comprises a plurality of alignment marks, when the at least one auxiliary alignment sheet covers a fixing structure at the fixed position and the two frames are arranged at any two of the alignment marks, the at least one auxiliary alignment sheet is adapted to be marked in at least one locking hole of each of the frames, the fixing structure is adapted to be drilled at the fixed position according to the mark of the at least one auxiliary alignment sheet, and each of the frames is adapted to be assembled to the fixing structure according to the hole drilled in the fixing structure.

15. The hanging assembly according to claim 1, wherein the hanging wire is a steel cable.

16. The hanging assembly according to claim 1, further comprising at least one cylinder, wherein the at least one cylinder is arranged on the frame, and the at least one flexible hanging cable is adapted to be wound around the at least one cylinder.

17. The hanging assembly according to claim 16, wherein the frame has at least one groove, and the at least one cylinder penetrates through the at least one groove and is adapted to be fixed at a plurality of different positions of the at least one groove.

18. The hanging assembly according to claim 17, wherein the number of the at least one groove is plural, and the at least one cylinder selectively penetrates through at least one of the grooves.

19. A display apparatus, comprising:
at least one display device; and
at least one hanging assembly, comprising:
at least one flexible hanging cable comprising a power wire and a hanging wire combined with each other;
at least one first fixing component connected to the at least one flexible hanging cable and adapted to be fixed at a fixed position; and
a frame, adapted to be fixed at the fixed position, wherein the at least one first fixing component is adapted to be fixed on the frame,
wherein the at least one first fixing component comprises a plate body and a cover body, and the plate body and the cover body are adapted to be combined to clamp the at least one flexible hanging cable between the plate body and the cover body, and
the plate body comprises a plurality of bumps, the cover body comprises a plurality of openings, the bumps are respectively embedded in the openings, and the at least one flexible hanging cable is wound around each of the bumps.

20. The display apparatus according to claim 19, wherein the power wire and the hanging wire are coaxially arranged.

21. The display apparatus according to claim 19, wherein the power wire is coated by the hanging wire.

22. The display apparatus according to claim 19, wherein a structural strength of the hanging wire is greater than a structural strength of the power wire.

23. The display apparatus according to claim 19, wherein the at least one flexible hanging cable comprises a protection layer, and the protection layer coats the power wire and the hanging wire.

24. The display apparatus according to claim 23, wherein a structural strength of the hanging wire is greater than a structural strength of the protection layer.

25. The display apparatus according to claim 23, wherein the at least one hanging assembly comprises at least one second fixing component connected to the at least one flexible hanging cable and adapted to be fixed on the at least one display device.

26. The display apparatus according to claim 19, wherein the number of the at least one hanging assembly is plural, the number of the at least one display device is plural, and the flexible hanging cables of the hanging assemblies are adapted to be respectively connected to the display devices, so that the display devices are connected in parallel with each other through the flexible hanging cables of the hanging assemblies.

* * * * *